United States Patent
Miyagi

(10) Patent No.: US 6,989,720 B2
(45) Date of Patent: Jan. 24, 2006

(54) RECEIVER

(75) Inventor: Hiroshi Miyagi, Jouetsu (JP)

(73) Assignee: Niigata Seimitsu Co., Ltd., Niigata (JP)

( * ) Notice: Subject to any disclaimer, the term of this patent is extended or adjusted under 35 U.S.C. 154(b) by 38 days.

(21) Appl. No.: 10/494,655

(22) PCT Filed: Nov. 12, 2002

(86) PCT No.: PCT/JP02/11762

§ 371 (c)(1),
(2), (4) Date: May 4, 2004

(87) PCT Pub. No.: WO03/043211

PCT Pub. Date: May 22, 2003

(65) Prior Publication Data

US 2005/0083154 A1   Apr. 21, 2005

(30) Foreign Application Priority Data

Nov. 13, 2001 (JP) ............................. 2001-347326

(51) Int. Cl.
  *H03L 5/00* (2006.01)
  *H03B 5/20* (2006.01)
(52) U.S. Cl. ................. 333/17.1; 331/117 R
(58) Field of Classification Search ............... 333/17.1, 333/17.3; 331/11, 117 R
See application file for complete search history.

(56) References Cited

U.S. PATENT DOCUMENTS

| | | | |
|---|---|---|---|
| 4,602,213 A * | 7/1986 | Sugiura | 324/307 |
| 5,216,392 A * | 6/1993 | Fraser et al. | 333/17.3 |
| 5,280,638 A * | 1/1994 | Porambo et al. | 455/143 |
| 6,188,287 B1 * | 2/2001 | Avanic et al. | 331/11 |
| 6,323,739 B1 * | 11/2001 | Andrews | 331/117 R |

FOREIGN PATENT DOCUMENTS

| | | |
|---|---|---|
| JP | 6-216795 | 8/1994 |
| JP | 6-252706 | 9/1994 |
| JP | 8-293714 | 11/1996 |
| JP | 9-64771 | 3/1997 |
| JP | 2000-278184 | 10/2000 |

* cited by examiner

*Primary Examiner*—Dean Takaoka
(74) *Attorney, Agent, or Firm*—Dellett & Walters

(57) ABSTRACT

A receiver capable of reducing the number of pads of a semiconductor device used for connection with a tuning circuit. The receiver includes a semiconductor device 100 containing various circuits and a tuning circuit 130 connected as a separate part to this semiconductor device 100. The semiconductor device 100 has a pad 112 formed on a semiconductor substrate 110, a processing circuit 114 connected via a capacitor 120 to the pad 112, and a D/A converter 122 connected via a resistor 124 to the pad 112. A tuning voltage generated by the D/A converter 122 is applied via the pad 112 to the tuning circuit 130. Moreover, an output signal of the tuning circuit 130 is supplied to the pad 112 and fed via the capacitor 120 to the processing circuit 114.

4 Claims, 1 Drawing Sheet

RECEIVER

TECHNICAL FIELD

The present invention relates to a receiver equipped with a tuning circuit and a semiconductor device connected in its subsequent stage.

BACKGROUND ART

If various kinds of entire apparatuses can be formed on one semiconductor substrate, there are various advantages such as production simplification, but in actual circuits, there are circuits suitable for transformation-into-semiconductor, circuits not suitable for transformation-into-semiconductor, or circuits which are impossible to transform them into semiconductors. For this reason, plenty of external components besides one or plural semiconductor devices which are constituted by using a semiconductor substrate are required. For example, in the case of a receiver, a high frequency circuit where a tuning circuit using a capacitor and a coil is included is prepared as a separate component, all or some of subsequent stages of circuits are formed as a semiconductor device on a semiconductor substrate, and the receiver is constituted by connecting these on a printed circuit board.

Generally, a pad formed on a semiconductor substrate is used so as to connect a preceding stage of circuit and a subsequent stage of semiconductor device in this manner.

FIG. 2 is a diagram showing a conventional connection status of a tuning circuit and a semiconductor device connected in its subsequent stage. A parallel resonance circuit consisting of a coil and variable capacitance diodes is included in a tuning circuit 200, and a tuning frequency is changed by changing a reverse bias of tuning voltage applied to the variable capacitance diodes. In addition, in a semiconductor device 210 connected in the subsequent stage of this tuning circuit 200, a pad 214 into which an output signal of the tuning circuit 200 is inputted, and a pad 216 for applying a tuning voltage to the variable capacitance diodes in the tuning circuit 200 are formed on a semiconductor substrate 212.

By the way, as mentioned above, in the semiconductor device 210, two pads 214 and 216 used for connection between with one tuning circuit 200 are required. In particular, in a general receiver, there was a problem that, since two or more sets of parallel resonance circuits by a coil and variable capacitance diodes which were provided in the tuning circuit 200 were provided, the number of the pads for tuning circuits formed on the semiconductor substrate 212 was required twice of the number of these parallel resonance circuits, and hence, an area which these pads occupied became large. In particular, although the number of pads for outputting and inputting signals among plenty of external components increases when the high densification and functionality of the semiconductor device 210 are achieved, in order to miniaturize the semiconductor device 210, it is desired to reduce the number of pads formed on the semiconductor substrate 212, and in particular, the number of pads for tuning circuits with a large ratio among them.

DISCLOSURE OF THE INVENTION

The present invention is created in view of such a point, and its object is to provide a receiver which can reduce the number of pads of a semiconductor device used for connection with a tuning circuit.

The receiver of the present invention has a tuning circuit and a semiconductor device including a processing circuit, into which an output signal of this tuning circuit is inputted, and a tuning voltage generating circuit which generates a tuning voltage changing a tuning frequency of the tuning circuit. In addition, the tuning circuit has variable capacitance diodes whose electrostatic capacity is made variable by a tuning voltage being applied. The semiconductor device has a common pad to which not only an output terminal of the tuning voltage generating circuit is connected, but also an input terminal of the processing circuit is connected via a capacitor. Then, one terminal of the variable capacitance diodes and the pad are connected. Since it is possible to commonly use a pad for the application of the tuning voltage and a pad for input/output of a signal between the tuning circuit and processing circuit by outputting and inputting an output signal of this tuning circuit by using a connection wire of applying the tuning voltage to the variable capacitance diodes which constitute the tuning circuit, it is possible to reduce the number of pads of the semiconductor device which are used for connection with the tuning circuit.

In addition, it is desirable that the processing circuit included in the semiconductor device, the tuning voltage generating circuit, pad, and capacitor are formed on a semiconductor substrate. Thereby, since a pad for connection inside the semiconductor device becomes unnecessary, it becomes possible to reduce the number of pads necessary in the entire semiconductor device.

Furthermore, it is desirable that the above-mentioned tuning circuit has a parallel resonance circuit where a coil and the variable capacitance diodes are parallel-connected. Owing to this, it becomes possible to fetch a signal component, tuned by the parallel resonance circuit, from one terminal of the variable capacitance diodes.

Moreover, it is desirable that the above-mentioned tuning circuit is equipped with two or more sets of parallel resonance circuits. Thereby, the effect of reducing the number of pads of the semiconductor device becomes further remarkable.

BEST MODE FOR CARRYING OUT THE INVENTION

Hereafter, a receiver according to an embodiment where the present invention is applied will be described with referring to drawings.

Figure 1:
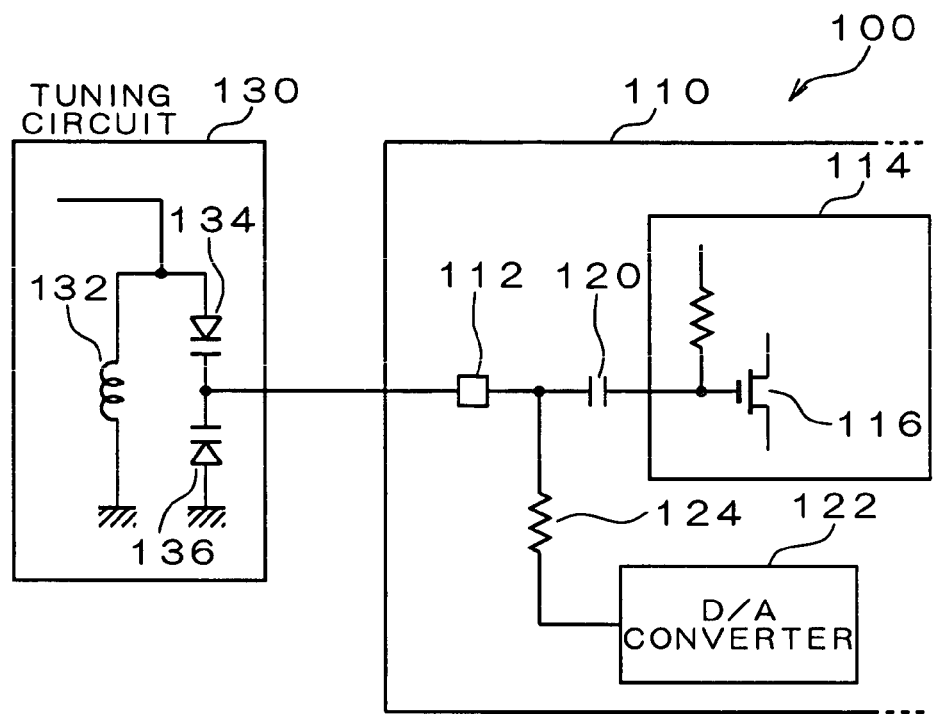
FIG. 1 is a diagram showing the partial structure of a receiver of an embodiment.
Figure 2:
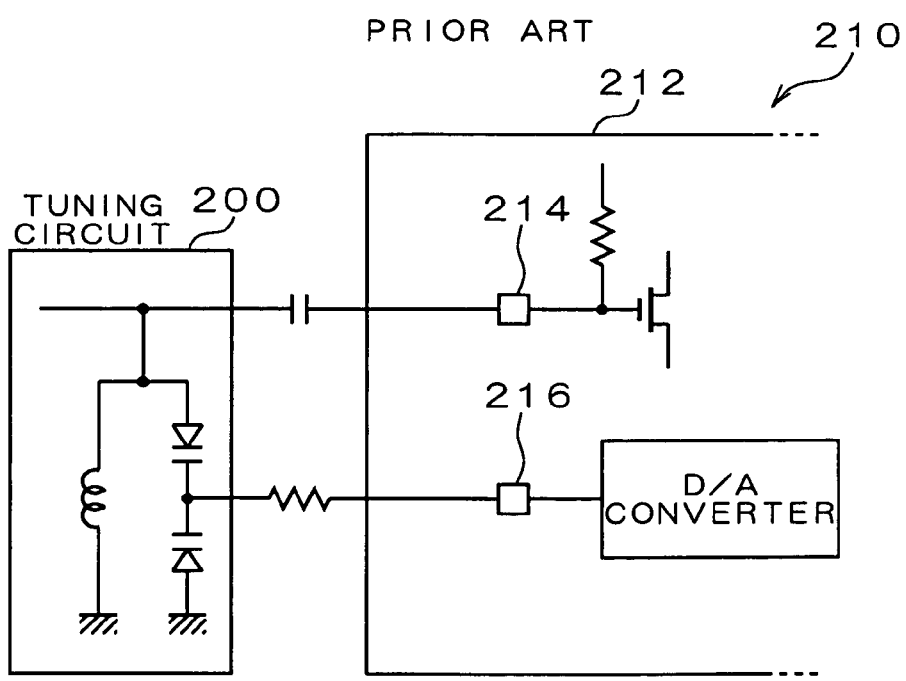
FIG. 2 is a diagram showing a conventional connection status of a tuning circuit and a semiconductor device connected in its subsequent stage.

FIG. 1 is a diagram showing the partial structure of the receiver of the embodiment. As shown in FIG. 1, the receiver of this embodiment has a semiconductor device 100, in which various kinds of circuits are included, and a tuning circuit 130 connected to this semiconductor device 100 as a separate component.

The tuning circuit 130 comprises a coil 132 and two variable capacitance diodes 134 and 136 whose cathode sides are connected each other. The two anode sides of variable capacitance diodes 134 and 136 are connected to both ends of the coil 132 respectively, and the parallel resonance circuit which determines a tuning frequency is constituted. It is possible to adjust the tuning frequency of this tuning circuit 130 by changing a reverse bias of tuning voltage applied from the external to the two cathode sides of the variable capacitance diodes 134 and 136.

The semiconductor device 100 has a pad 112 formed on the semiconductor substrate 110, a processing circuit 114 connected to the pad 112 via a capacitor 120, and a digital-to-analog (D/A) converter 122 connected to the pad 112 via a resistor 124. The processing circuit 114 performs predetermined processing to a signal inputted from the tuning circuit 130 via the pad 112. For example, after receiving the output signal of the tuning circuit 130 in an FET 116 and performing high frequency amplification of this signal, the processing circuit 114 performs frequency conversion processing of mixing a local oscillation signal. The capacitor 120 is provided for impedance matching or removal of direct current. The digital-to-analog converter 122 is a tuning voltage generating circuit which generates the tuning voltage of the tuning circuit 130, and the generated tuning voltage is applied to the tuning circuit 130 via the resistor 124, which has sufficiently large resistance, and the pad 112.

The receiver of this embodiment has such structure, and its operation will be explained.

The digital-to-analog converter 122 generates a predetermined tuning voltage. This tuning voltage is applied to the cathode sides of the variable capacitance diodes 134 and 136 in the tuning circuit 130 via the resistor 124 and pad 112. In addition, the output signal of the tuning circuit 130 is transmitted via the connection wire used for this tuning voltage application. That is, since the signal which appears in the one terminal of the coil 132 is divided by the two variable capacitance diodes 134 and 136, the signal component tuned by the parallel resonance circuit consisting of these elements appears also in the two cathode sides of the variable capacitance diodes 134 and 136. Hence, the output signal of the tuning circuit 130 is inputted into the pad 112 of the semiconductor device 100 via the connection wire for application of the tuning voltage. Thus, the signal inputted into the pad 112 is further sent to the processing circuit 114 via the capacitor 120, and predetermined processing is performed.

In this manner, since it is possible to commonly use a pad for tuning voltage application and a pad for input/output of a signal between the tuning circuit 130 and processing circuit 114 by outputting and inputting an output signal of this tuning circuit 130 by using the connection wire of applying a tuning voltage to the variable capacitance diodes 134 and 136 which constitute the tuning circuit 130, it is possible to reduce the number of pads of the semiconductor device 100 which are used for connection with the tuning circuit 130.

In particular, in a general receiver, the number of pads of the entire semiconductor device 100 can be sharply reduced by reducing the number of pads according to respective sets since two or more sets of parallel resonance circuits by the coil 132 and variable capacitance diodes 134 and 136 are provided in many cases.

In addition, since the processing circuit 114 included in the semiconductor device 100, the digital-to-analog converter 122, pad 112, and capacitor 120 are formed on the semiconductor substrate 110, another pad for connecting these becomes unnecessary, and hence, it becomes possible to reduce the number of pads necessary in the entire semiconductor device 100.

INDUSTRIAL APPLICABILITY

As mentioned above, according to the present invention, since it is possible to commonly use a pad for tuning voltage application and a pad for input/output of a signal between the tuning circuit and processing circuit by outputting and inputting an output signal of this tuning circuit by using a connection wire of applying a tuning voltage to the variable capacitance diodes which constitute the tuning circuit, it is possible to reduce the number of pads of the semiconductor device which are used for connection with the tuning circuit.

What is claimed is:

1. A receiver which has a tuning circuit and a semiconductor device including a processing circuit, into which an output signal of this tuning circuit is inputted, and a tuning voltage generating circuit which generates a tuning voltage changing a tuning frequency of the tuning circuit, the receiver characterized in that the tuning circuit has variable capacitance diodes whose electrostatic capacity is made variable by the tuning voltage being applied;

that the semiconductor device has a common pad to which not only an output terminal of the tuning voltage generating circuit is connected, but also an input terminal of the processing circuit is connected via a capacitor; and that one terminal of the variable capacitance diodes and the pad are connected.

2. The receiver according to claim 1, characterized in that the processing circuit, the tuning voltage generating circuit, the pad, and the capacitor, included in the semiconductor device, are formed on a semiconductor substrate.

3. The receiver according to claim 1, characterized in that the tuning circuit has a parallel resonance circuit where a coil and the variable capacitance diodes are parallel-connected.

4. The receiver according to claim 3, characterized in that the tuning circuit is equipped with two or more sets of said parallel resonance circuits.

* * * * *